United States Patent
Hussain

(10) Patent No.: US 11,545,436 B2
(45) Date of Patent: Jan. 3, 2023

(54) FLEXIBLE THREE-DIMENSIONAL ELECTRONIC DEVICE

(71) Applicant: KING ABDULLAH UNIVERSITY OF SCIENCE AND TECHNOLOGY, Thuwal (SA)

(72) Inventor: Muhammad Mustafa Hussain, Hercules, CA (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/962,595

(22) PCT Filed: Mar. 4, 2019

(86) PCT No.: PCT/IB2019/051743
§ 371 (c)(1),
(2) Date: Jul. 16, 2020

(87) PCT Pub. No.: WO2019/171257
PCT Pub. Date: Sep. 12, 2019

(65) Prior Publication Data
US 2020/0357745 A1 Nov. 12, 2020

Related U.S. Application Data

(60) Provisional application No. 62/639,141, filed on Mar. 6, 2018.

(51) Int. Cl.
*H01L 23/538* (2006.01)
*H01L 21/768* (2006.01)
(Continued)

(52) U.S. Cl.
CPC .... *H01L 23/5384* (2013.01); *H01L 21/76898* (2013.01); *H01L 23/5387* (2013.01);
(Continued)

(58) Field of Classification Search
CPC .......... H01L 23/5384; H01L 21/76898; H01L 23/5387
See application file for complete search history.

(56) References Cited

U.S. PATENT DOCUMENTS

| 2015/0028479 A1* | 1/2015 | Ebefors | H01L 23/49822 257/738 |
| 2015/0043177 A1 | 2/2015 | Tuominen et al. | |
| 2016/0163765 A1 | 6/2016 | Hu et al. | |

FOREIGN PATENT DOCUMENTS

| CN | 103607855 B * | 6/2016 |
| JP | 2002246536 A | 8/2002 |
| WO | 2013009833 A1 | 1/2013 |

OTHER PUBLICATIONS

Burns, J.A., et al., "A Wafer-Scale 3-D Circuit Integration Technology," IEEE Transactions on Electron Devices, Oct. 2006, vol. 53, No. 10, pp. 2507-2516, IEEE.
(Continued)

*Primary Examiner* — Errol V Fernandes
(74) *Attorney, Agent, or Firm* — Patent Portfolio Builders PLLC

(57) ABSTRACT

A flexible three-dimensional electronic device includes a polymer layer having a first side and a second side that is opposite of the first side. A first flexible substrate carrying a first electronic component is arranged on the first side of the polymer layer. A second flexible substrate carries a second electronic component. The second flexible substrate is a flexible silicon substrate arranged on the second side of the polymer layer. An electrically conductive via passes through the polymer layer to electrically connect the first and second electronic components.

20 Claims, 10 Drawing Sheets

(51) Int. Cl.
  H01L 23/00 (2006.01)
  H01L 25/065 (2006.01)
  H01L 25/18 (2006.01)
  H01L 25/00 (2006.01)
(52) U.S. Cl.
  CPC .............. *H01L 24/32* (2013.01); *H01L 24/83* (2013.01); *H01L 25/0657* (2013.01); *H01L 25/18* (2013.01); *H01L 25/50* (2013.01); *H01L 2224/32145* (2013.01); *H01L 2224/83005* (2013.01); *H01L 2224/83359* (2013.01); *H01L 2224/83862* (2013.01); *H01L 2225/06544* (2013.01); *H01L 2924/0665* (2013.01)

(56) References Cited

OTHER PUBLICATIONS

Chen, K.N., et al., "Integration Schemes and Enabling Technologies for Three-Dimensional Integrated Circuits," IET Computers & Digital Techniques, May 27, 2011, vol. 5, Issue 3, pp. 160-168.
Garrou, P., et al., "Handbook of 3D Integration: vol. 1—Technology and Applications of 3D Integrated Circuits," Sep. 22, 2011, John Wiley & Sons.
Ghoneim, M.T., et al., "Additive Advantage in Characteristics of MIMCAPs on Flexible Silicon (100) Fabric with Release-First Process," Physica Status Solidi RRL, Nov. 20, 2013, Vo. 8, No. 2, pp. 163-166, WILEY-VCH Verlag GmbH & Co. KGaA, Weinheim.
Hussain, A.M., et al., "CMOS—Technology-Enabled Flexible and Stretchable Electronics for Internet of Everything Applications," Advanced Materials, Nov. 26, 2015, vol. 28, pp. 4219-4249, WILEY-VCH Verlag GmbH & Co. KGaA, Weinheim.
Hussain, A.M., et al., "Deterministic Integration of Out-of-Plane Sensor Arrays for Flexible Electronic Applications," Small, Jul. 25, 2016, vol. 12, No. 37, pp. 5141-5145, WILEY-VCH Verlag GmbH & Co. KGaA, Weinheim.
International Search Report in corresponding/related International Application No. PCT/IB2019/051743, dated Jul. 4, 2019.

Knickerbocker, J.U., et al., "3-D Silicon Integration and Silicon Packaging Technology Using Silicon Through-Vias," IEEE Journal of Solid-Stage Circuits, Aug. 2006, vol. 41, No. 8, pp. 1718-1725, IEEE.
Knickerbocker, J.U., et al., "Three-Dimensional Silicon Integration," IBM Journal of Research and Development, Nov. 2008, vol. 52, No. 6, pp. 553-569.
Menard, E., et al., "Bendable Single Crystal Silicon Thin Film Transistors Formed by Printing on Plastic Substrates," Applied Physics Letters, 2005, vol. 86, pp. 093507-1-093507-3, American Institute of Physics.
Rojas, J.P., et al., "Flexible Semi-Transparent Silicon (100) Fabric with High-K/Metal Gate Devices," Physica Status Solidi RRL, Jan. 7, 2013, Vo. 7, No. 3, pp. 187-191, WILEY-VCH Verlag GmbH & Co KGaA, Weinheim.
Rojas, J.P., et al., "Transformational Silicon Electronics," ACS Nano, Jan. 29, 2014, vol. 8, No. 2, pp. 1468-1474, American Chemical Society.
Sun, L., et al., "12-GHz Thin-Film Transistors on Transferrable Silicon Nanomembranes for High-Performance Flexible Electronics," Small, Sep. 27, 2010, vol. 6, No. 22, pp. 2553-2557, WILEY-VCH Verlag GmbH & Co. KGaA, Weinheim.
Topol, A.W., et al., " Three-Dimensional Integrated Circuits," IBM Journal of Research and Development, Jul.-Sep. 2006, vol. 50, No. 4/5, ABI/INFORM Collection, pp. 491-506.
Torres Sevilla, G.A., et al., "Flexible and Semi-Transparent Thermoelectric Energy Harvesters from Low Cost Bulk Silicon (100)," Small, Jul. 9, 2013, vol. 9, No. 23, pp. 3916-3921, WILEY-VCH Verlag GmbH & Co. KGaA, Weinheim.
Williams, K.R., et al., "Etch Rates for Micromachining Processing—Part II," Journal of Microelectromechanical Systems, Dec. 2003, Bol. 12, No. 6, pp. 762-778, IEEE.
Written Opinion of the International Searching Authority in corresponding/related International Application No. PCT/IB2019/051743, dated Jul. 4, 2019.
Zhang, K., et al., "Fast Flexible Electronics Using Transferrable Silicon Nanomembranes," Journal of Physics D: Applied Physics, Mar. 23, 2012, vol. 45, 14 pp., IOP Publishing.

\* cited by examiner

FLEXIBLE THREE-DIMENSIONAL ELECTRONIC DEVICE

CROSS-REFERENCE TO RELATED APPLICATIONS

This application is a U.S. National Stage Application of International Application No. PCT/IB2019/051743, filed on Mar. 4, 2019, which claims priority to U.S. Provisional Patent Application No. 62/639,141, filed on Mar. 6, 2018, entitled "CMOS COMPATIBLE LOW TEMPERATURE 3D INTEGRATION STRATEGY OF HETEROGENEOUS SUBSTRATES," the disclosures of which are incorporated herein by reference in their entirety.

BACKGROUND

Technical Field

Embodiments of the subject matter disclosed herein generally relate to a flexible three-dimensional electronic device with at least two flexible substrates interposed by a polymer layer and having an electrically conductive via passing through the polymer layer to electrically connect electronic components on the two flexible substrates.

Discussion of the Background

The desire to reduce the size of electronic devices has led to the development of three-dimensional integrated circuits (3D-IC), which are herein referred to as three-dimensional electronic devices. Three-dimensional electronic devices are typically produced by either forming subsequent electronic components on top of the existing stack of electronic components or forming the electronic components separately and then stacked them together.

Forming subsequent electronic components on top of the existing stack of electronic components is problematic from a thermal perspective because forming the subsequent electronic component requires temperatures that will destroy the existing stack of electronic components.

Forming the electronic components separately requires releasing the individual electronic components from their original substrate, aligning the individual electronic components with other electronic components in the vertical stack, bonding the electronic components of the stack, and forming vertical vias to electrically couple the electronic components in the vertical stack. Current techniques for forming vias through silicon substrates on which the electronic components are carried in the stack requires very high temperatures that are incompatible with the bonding agents used to attach the electronic components to each other. Thus, the formation of the vias can result in issues thermal, chemical and mechanical reliability of the bonding between layers.

Further, conventional three-dimensional electronic devices typically employ rigid substrates to carry each individual electronic component. This limits the uses for three-dimensional electronic devices because the circuits have a planar shape and cannot conform to non-planar surfaces.

Thus, there is a need for three-dimensional electronic devices having good mechanical reliability. Further, there is a need for flexible three-dimensional electronic devices having good mechanical reliability.

SUMMARY

According to an embodiment, there is a flexible three-dimensional electronic device, which includes a polymer layer having a first side and a second side that is opposite of the first side. A first flexible substrate carrying a first electronic component is arranged on the first side of the polymer layer. A second flexible substrate carries a second electronic component. The second flexible substrate is a flexible silicon substrate arranged on the second side of the polymer layer. An electrically conductive via passes through the polymer layer to electrically connect the first and second electronic components.

According to another embodiment, there is a method for forming a three-dimensional electronic device. A first flexible substrate carrying a first electronic component is arranged on a carrier wafer. A polymer layer is formed on the first flexible substrate. A second flexible substrate carrying a second electronic component is arranged on the polymer layer. The second flexible substrate is a flexible silicon substrate. An electrically conductive via passing through the polymer layer and electrically connecting the first and second electronic components is formed using electrochemical deposition.

According to a further embodiment, there is a flexible three-dimensional electronic device, which includes a first polymer layer having a first side and a second side that is opposite of the first side. A first flexible substrate carrying a first electronic component and a first electrical contact is arranged on the first side of the first polymer layer. A second flexible substrate carrying a second electronic component and a second and a third electrical contact is arranged on the second side of the first polymer layer. A second polymer layer having a first side and a second side that is opposite of the first side is arranged on the first side of the second polymer layer. A third flexible substrate carrying a third electronic component and a fourth electrical contact is arranged on the second side of the second polymer layer. A first electrically conductive via is electrically coupled to the first and second electrical contacts and passes through the first polymer layer and the second flexible substrate. A second electrically conductive via is electrically coupled the third and fourth contacts and passes through the second polymer layer and the third flexible substrate.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of flexible three-dimensional electronic devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
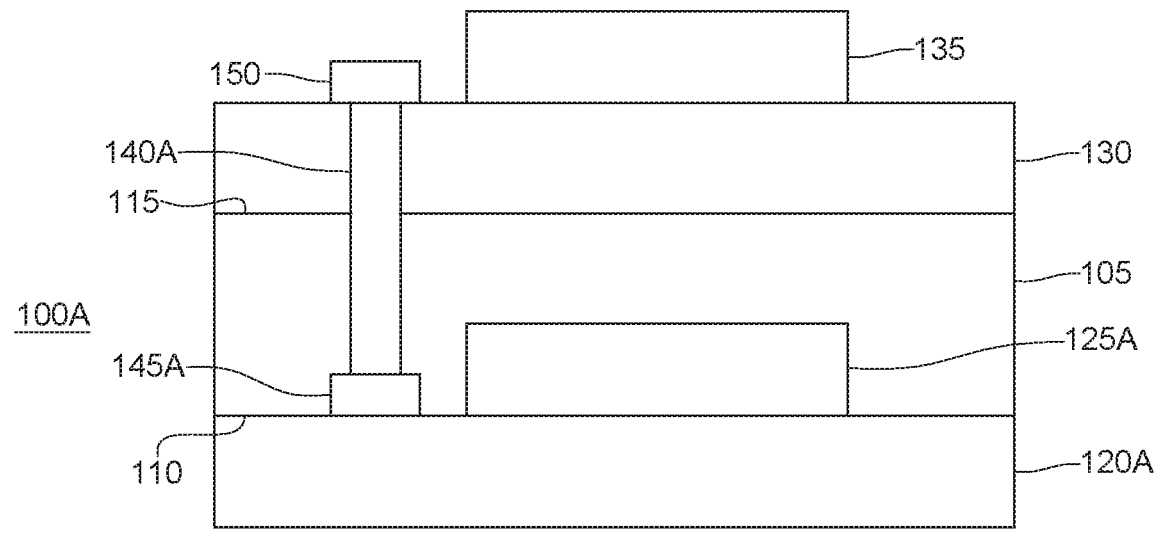
FIGS. 1A-1D are schematic diagrams of flexible three-dimensional electronic devices according to embodiments.

FIGS. 1A-1D are schematic diagrams of flexible three-dimensional electronic devices according to embodiments. Referring first to FIG. 1A, a flexible three-dimensional electronic device 100A includes a polymer layer 105 having a first side 110 and a second side 115 that is opposite of the first side 110. A first flexible substrate 120A carrying a first electronic component 125A is arranged on the first side 110 of the polymer layer 105. A second flexible substrate 130 carrying a second electronic component 135 is arranged on the second side 115 of the polymer layer 105. The second flexible substrate is a flexible silicon substrate. An electrically conductive via 140A passes through the polymer layer 105 to electrically connect the first 125A and second electronic 135 components. Specifically, a first electrical contact 145A is electrically connected to the first electronic component 120A and arranged on a top surface of the first flexible substrate 125A and a second electrical contact 150 is electrically connected to the second electronic component 135 and arranged on a top surface of the second flexible substrate 135.

Figure 1B:
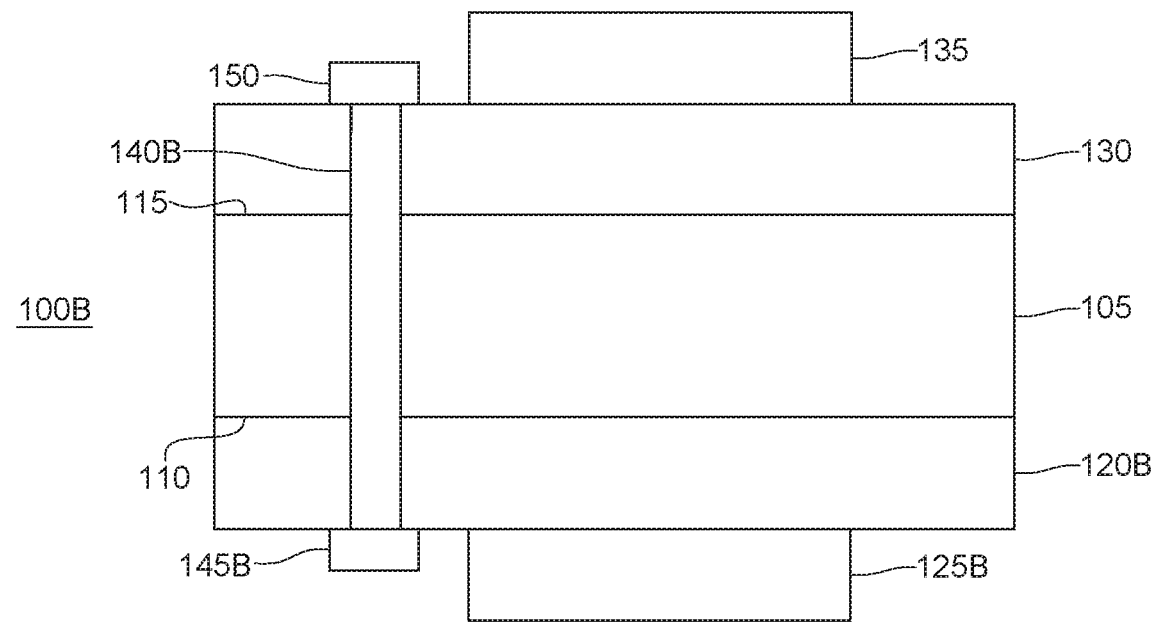

The flexible three-dimensional electronic device 110B illustrated in FIG. 1B is similar to that illustrated in FIG. 1A except that the first electronic component 125B and first electrical contact 145B are arranged on the bottom surface of the first flexible substrate 120B and the electrically conductive via passes through the first flexible substrate 120B. The arrangement of the first 125B and second 135 electronic devices in FIG. 1B is particularly advantageous when the electronic components need access to the environment, such as sensors, solar cells, etc.

Figure 1C:
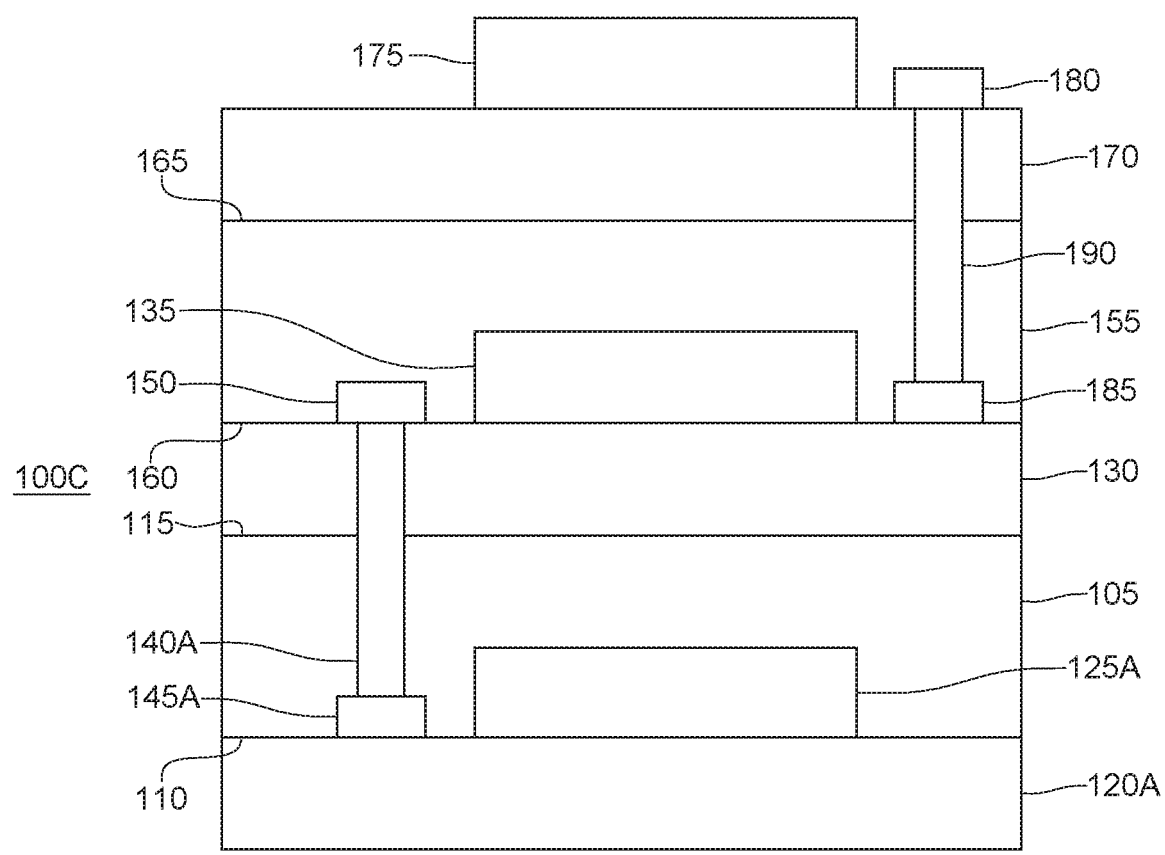

FIG. 1C illustrates a flexible three-dimensional electronic device 100C having three flexible substrates respectively carrying three electronic devices. The flexible three-dimensional electronic device 100C in FIG. 1C includes the first electronic component arranged in the same manner as in FIG. 1A, and accordingly, the common aspects between FIGS. 1A and 1C will not be described any further and reference can be made to the discussion above in connection with FIG. 1A.

In this embodiment, a second polymer layer 155 is arranged so that the second flexible substrate 130 is on a first side 160 of the second polymer layer 155 and a third flexible substrate 170 is arranged on a second side 165 of the second polymer layer 155. The third flexible substrate 170 carries a third electronic device 175 and a third electrical contact 180. The second flexible substrate 130 carries a fourth electrical contact 185. A second electrically conductive via 190 is electrically coupled to the third 180 and fourth 185 electrical contacts and passes through the second polymer layer 155 and the third flexible substrate 170.

Figure 1D:
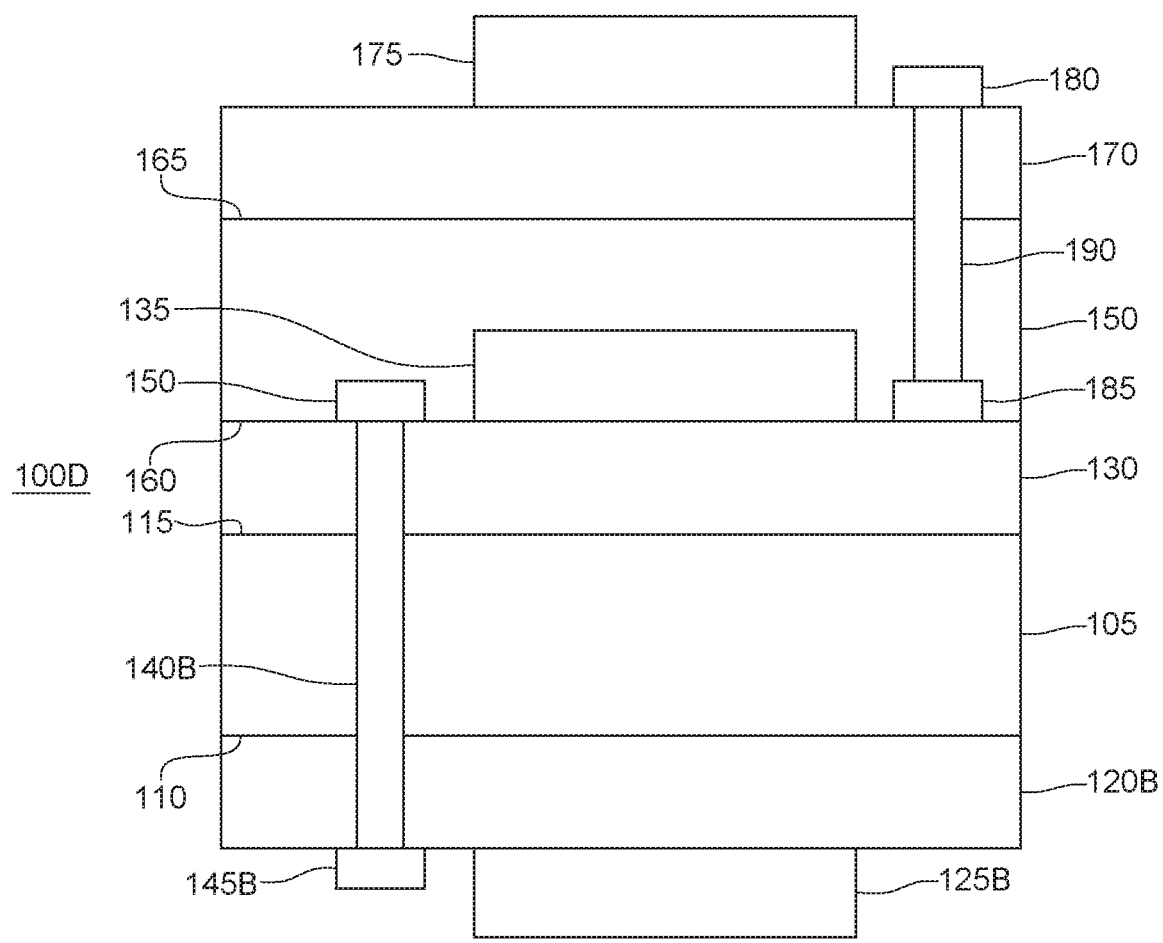

The flexible three-dimensional electronic device 100D illustrated in FIG. 1D includes the first electronic component arranged in the same manner as in FIG. 1B and the third flexible substrate 170 and other associated elements arranged as illustrated in FIG. 1C. Accordingly, a further discussion of this arrangement is not provided, and reference can be made to the discussions above in connection with FIGS. 1B and 1C.

The flexible three-dimensional electronic devices 100A-100D are merely examples of electronic devices according to embodiments, and these devices can include additional flexible substrates and intervening polymer layers. Further, more than one electrically conductive via can be employed to connect electronic components on two of the flexible substrates. Moreover, the flexible substrates can each carry more than one electronic component, depending upon the intended application of the electronic device.

The electronic components 125A, 125B, 135, and 175 can be any type of electronic components, including CMOS components. As those skilled in the art will recognize, a CMOS component is an electronic component formed using complimentary metal-oxide semiconductor technology. For example, the electronic components 125A, 125B, 135, and 175 can be CMOS integrated circuits, such as processors and memories. The electronic components 125A, 125B, 135, and 175 can also be metallic sensors, antennas, resistors, capacitors (e.g., metal-insulator-metal capacitors) solar cells, or any other type of electronic component. In one example, the flexible semiconductor device can include a polyimide-based sensor pad array with top contacts as the second electronic component and silicon electronics for control and data transmission as the first electronic component.

The flexible substrates 120A, 120B, 130, and 170 can be flexible polyimide substrates and/or flexible silicon substrates. A flexible silicon substrate is one that is thin enough to flex without breaking. One technique for forming a flexible silicon substrate is disclosed in WO 2013/009833 (also published as U.S. Pat. No. 9,209,083). This technique involves forming a number of holes in a silicon substrate supporting an electronic component and then removing a top portion of the silicon substrate from the bulk of the silicon substrate. The holes pass from the top to the bottom of the silicon substrate. This process can form silicon substrates having a thickness between 5-20 µm that is mechanically flexible without damaging the silicon substrate.

The polymer layer 105 can be a bonding layer used to mechanically attach the flexible substrates to each other. The polymer layer can be, for example, a layer of SU-8, which is an epoxy-based resin with a single monomer containing eight epoxide groups.

Figure 2:
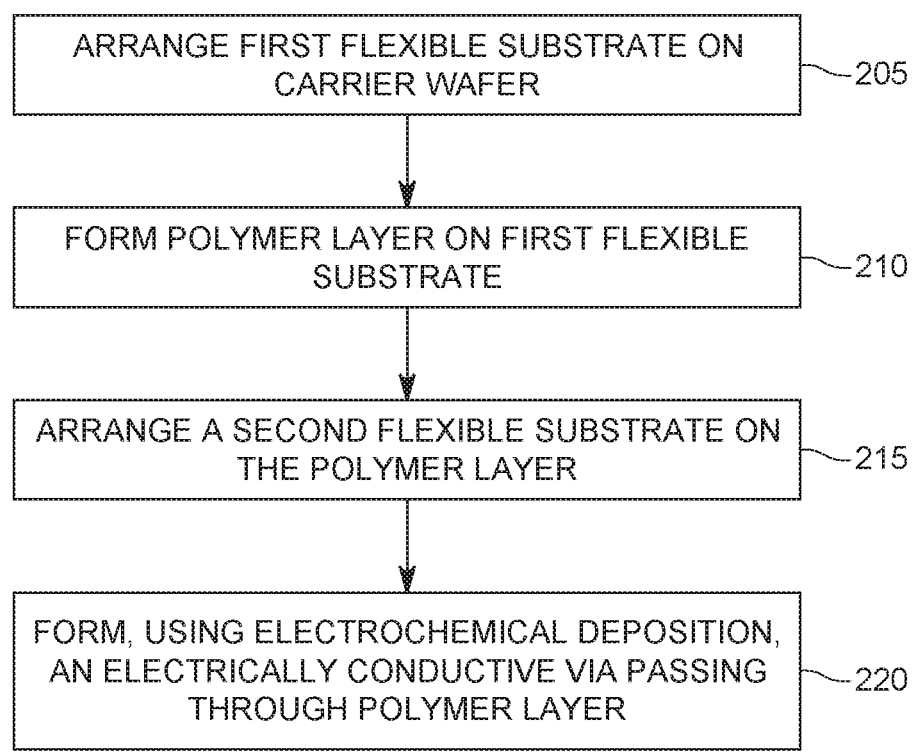
FIG. 2 is a flow chart of a method for forming a flexible three-dimensional electronic device according to an embodiment.

FIG. 2 is a flow chart illustrating a method for making the flexible electronic devices discussed above in connection with FIGS. 1A and 1B. This method can be extended to make the flexible electronic devices of FIGS. 1C and 1D. Initially, a first flexible substrate 120A or 120B carrying a first electronic component 125A or 125B is arranged on a carrier wafer (step 205). A polymer layer 105 is formed on the first flexible substrate 120A or 120B (step 210). A second flexible substrate 130 carrying a second electronic component 135 is arranged on the polymer layer 105 (step 215). The second flexible substrate 130 is a flexible silicon substrate. An electrically conductive via 140A or 140B passing through the polymer layer 105 and electrically connecting the first 125A or 125B and second 130 electronic components is formed using electrochemical deposition (step 220).

Figure 3:
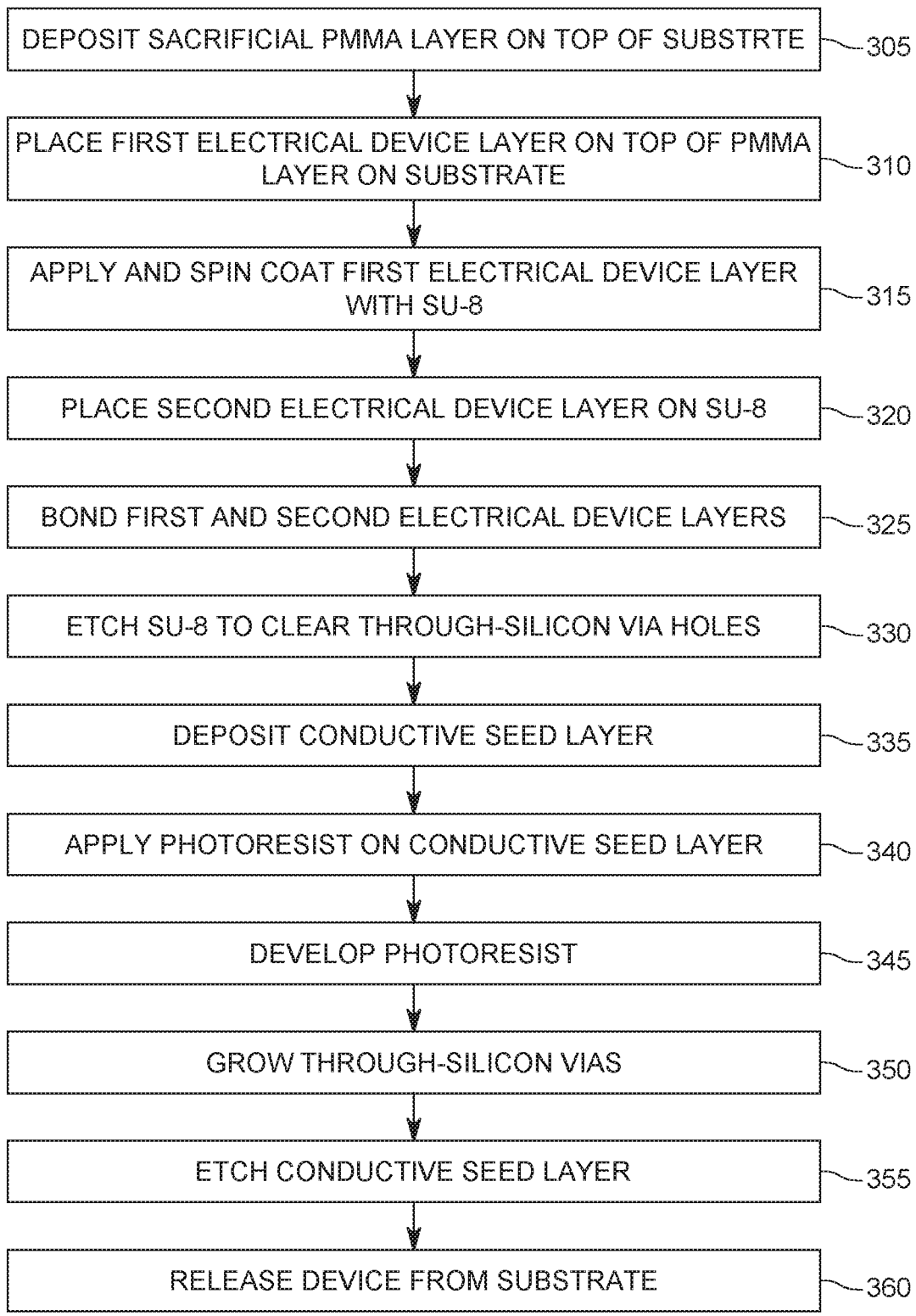
FIG. 3 is a flowchart of a method of forming a flexible three-dimensional electronic device according to an embodiment.
Figure 4A:
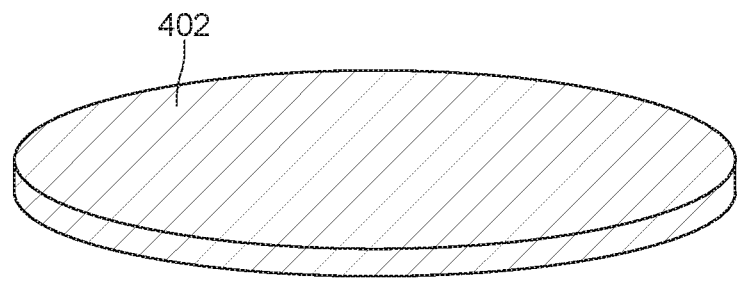
FIGS. 4A-4N are schematic diagrams of a method of forming a flexible three-dimensional electronic device according to an embodiment.
Figure 4B:
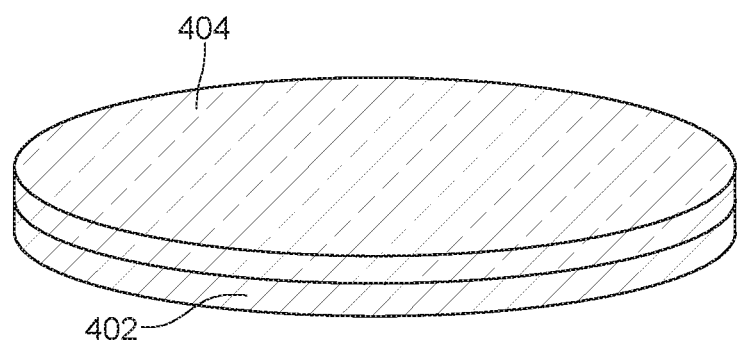

A more detailed description of a method for forming a flexible three-dimensional electronic device according to an embodiment will now be discussed in more detail in connection with FIGS. 3 and 4A-4N. Initially, a sacrificial PMMA layer 404 is deposited on top of a carrier wafer 402 (step 305 and FIGS. 4A and 4B). The use of PMMA for layer 404 is particularly advantageous because it can be subsequently etched using, for example, acetone without harming the electronic devices in the vertical stack.

Figure 4C:
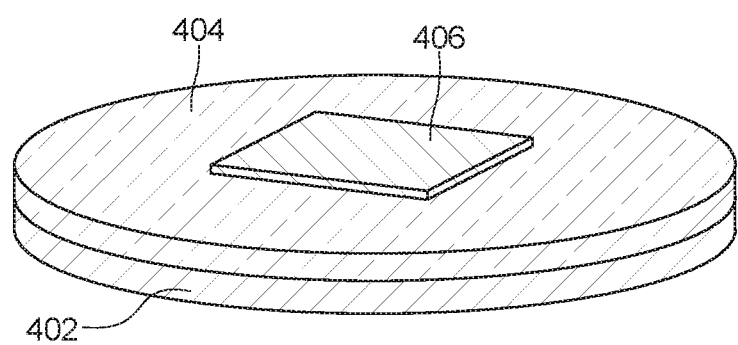
Figure 4D:
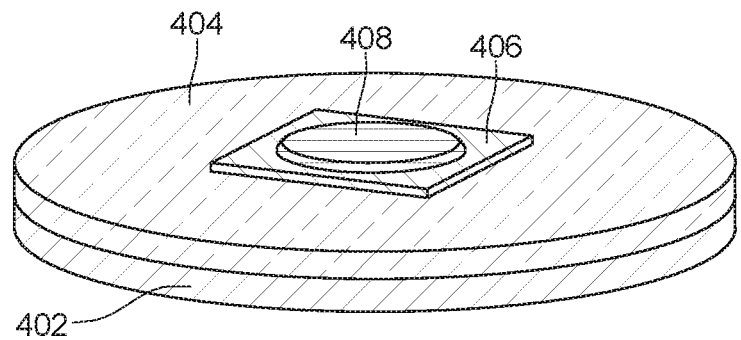
Figure 4E:
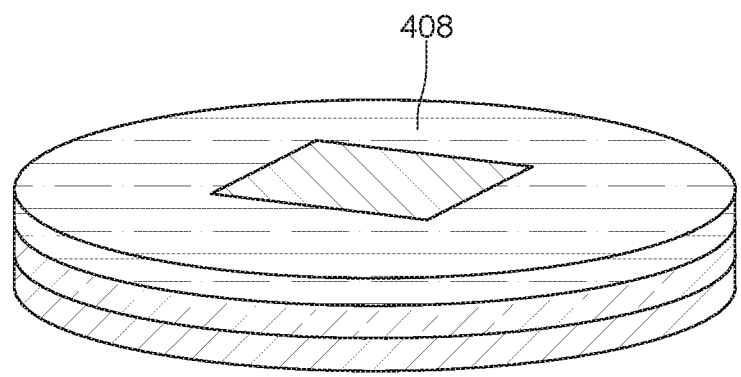

A first electrical device layer 406, which includes a flexible substrate carrying an electronic device, is placed on top of the PMMA layer 404 on the carrier wafer 402 (step 310 and FIG. 4C). In an embodiment, the first electrical device layer 406 includes, for example, a 30 μm thick flexible silicon substrate. SU-8 408 is applied to the first electrical device layer 406 (FIG. 4D) and then spin coated on the first electrical device layer 406 (step 315 and FIG. 4E). SU-8 is subsequently used as a bonding agent to bond the first and second electrical devices layers to each other. SU-8 is particularly advantageous because it inert to the acetone used to release the PMMA layer and also can be activated as the bonding agent at temperatures that do not affect the first and second electronic devices during the bonding process.

Figure 4F:
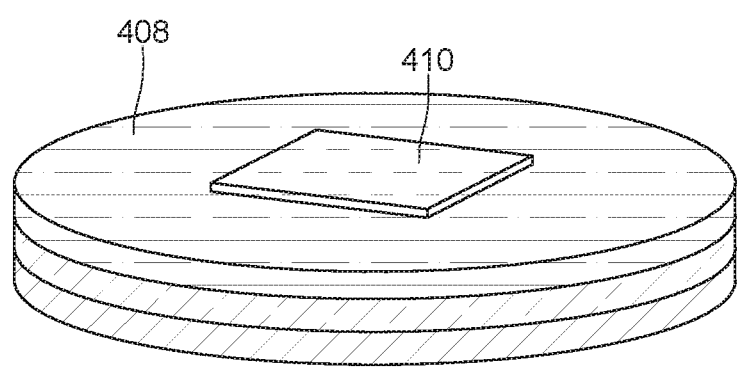
Figure 4G:
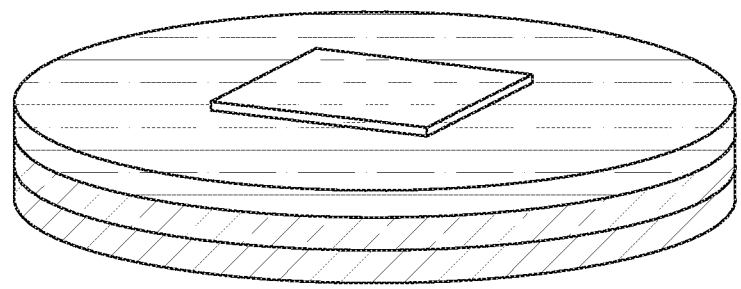

A second electrical device layer 410, which includes a flexible substrate carrying an electronic device, is then placed on the spin-coated SU-8 408 (step 320 and FIG. 4F). The first 406 and second 410 electrical device layers are then bonded (step 325 and FIG. 4G). The bonding can involve, for example heating the carrier wafer 402 at 95° C. for three minutes, as a pre-exposure bake, followed by exposing the SU-8 to ultraviolet radiation for six seconds, which activates the formation of an acid through a photochemical reaction with photo acid generator salt. The carrier wafer can then be heated at 95° C. for three minutes to initiate the polymerization process, during which the acid acts as a catalyst. Performing the baking and curing of the SU-8 at 95° C. results in the sacrificial PMMA layer 404 being unaffected by the bonding of the first 406 and second 410 electrical device layers. SU-8 has multiple polymerization sites per monomer with polymerization generally occurring in three dimensions, which results in the cross-linking of multiple polymer chains together to form gigantic three-dimensional molecules. These massive molecules provide mechanical and chemical stability to the cured and cross-linked SU-8 films. Generally, cross-linked SU-8 thin films are thermally stable up to 200° C. and chemically inert to most organic solvents, and thus are ideal for bonding thin flexible substrates, such as flexible silicon substrates.

Figure 4H:
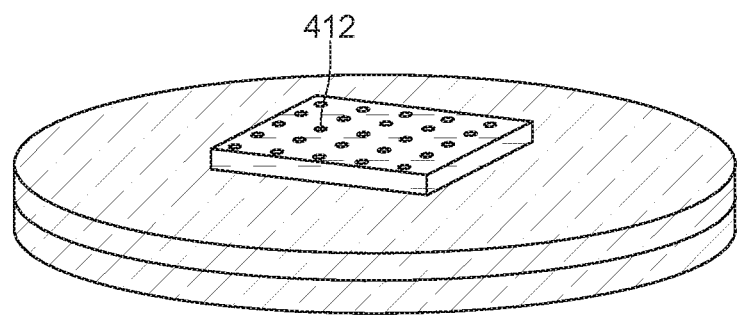

The spin-coated SU-8 408 is then etched to form holes 412 for the through-silicon vias that will be subsequently formed to electrically couple the first 406 and second 410 electrical device layers (step 330 FIG. 4H). Because the SU-8 was uncured when the second electric device layer 410 is placed on the SU-8, the SU-8 may flow into holes in the substrate of the second electric device layer 410 and thus the SU-8 should be removed from the holes prior to forming the via. This can be achieved, for example, using 02 (50 sccm)/$CF_4$ (5 sccm) plasma reactive ion etching (RIE) at 10° C. with 150 W radio frequency power and 1500 W inductively coupled plasma (ICP power). The chamber in which the device is being formed can be maintained at a chamber pressure of, for example, 80 mTorr and the etching can take, for example, 12 minutes.

Figure 4I:
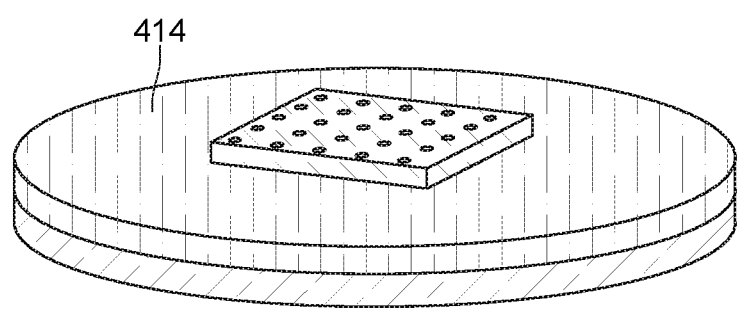

A conductive seed layer 414 (e.g., comprising 10 nm of chromium and 150 nm of gold) is then deposited on the PMMA layer 404 and the second electrical device layer 410 (step 335 and FIG. 4I). This deposition can employ, for example, an argon sputtering process (25 sccm argon, 5 mTorr, room temperature, 400 W, ESC metal sputtering system).

Figure 4J:
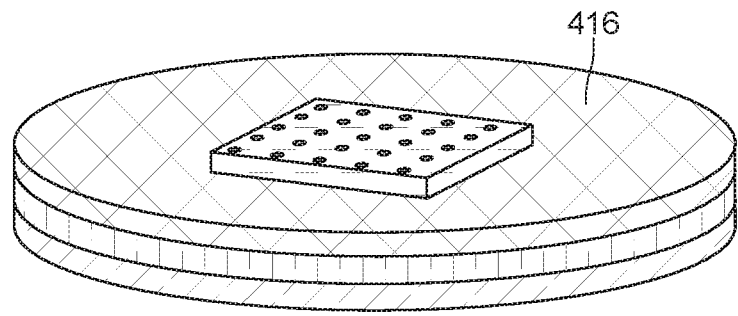

A photoresist 416 is spin coated on the conductive seed layer 414 (step 340 and FIG. 4J). In an embodiment, the photoresist 416 is a negative photoresist, which allows the photoresist to be easily removed from the holes 412 for the subsequent formation of the through-silicon vias. The photoresist can be, for example, AZ NLOF 2070, spun at 3000 r.p.m. for thirty seconds.

Figure 4K:
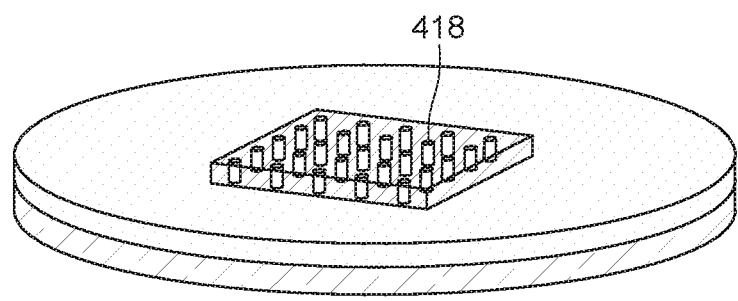

The photoresist 416 can then be developed to grow the through-silicon vias 418 (step 345 and FIG. 4K). This can involve, for example, prebaking the photoresist 416 at 100° C. for seven minutes and exposed at 200 mJ/$cm^2$. The photoresist 416 can then be post-baked at, for example, at 110° C. for sixty seconds and developed using AZ 726 MIF bath for three minutes.

Figure 4L:
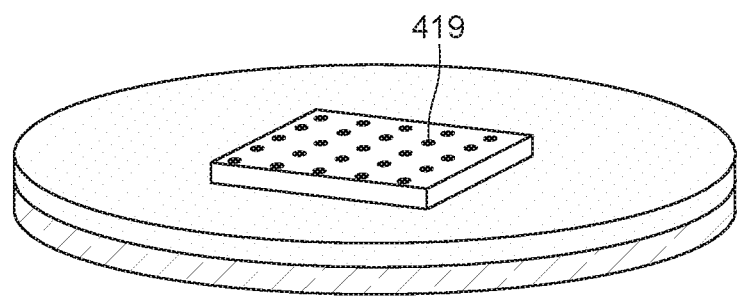

Once the photoresist 416 is removed, the growth of the electrically conductive vias 419 is performed using electrochemical deposition of the conductive seed layer 414 (step 350 and FIG. 4L). This can be achieved, for example, by growing copper using a $CuSO_4$ bath at 25° C. with an average forward current of 0.2 A. A better conformal deposition of the conductive seed layer 414 on the sidewalls of the holes for the electrically conductive vias can be achieved by placing the device at an angle to the sputter targets. After growing the conductive seed layer 414, the photoresist 416 is removed, for example, using an acetone bath.

Figure 4M:
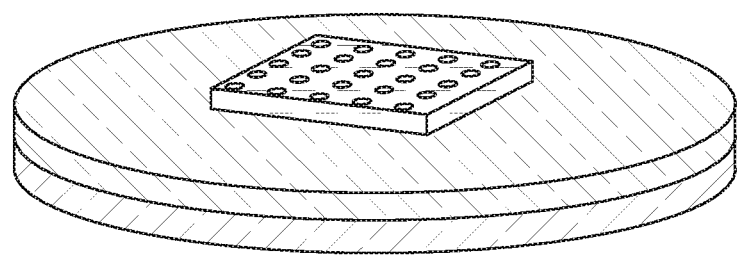
Figure 4N:
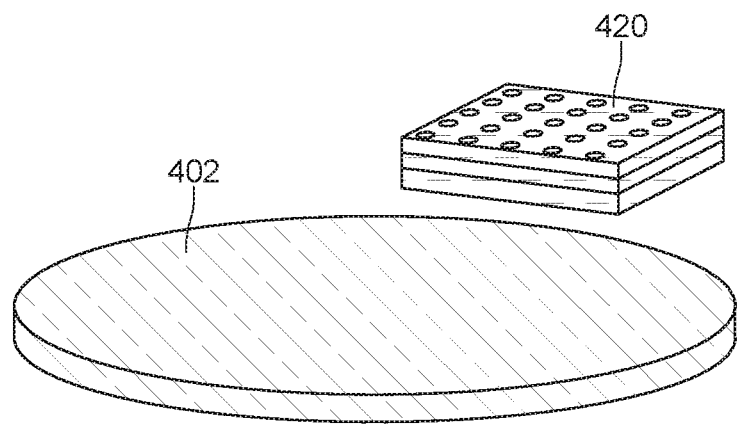

The conductive seed layer 414 is etched to remove excess metal (step 355 and FIG. 4M). This can be achieved using, for example, an argon plasma RIE (50 sccm, 10° C.). Finally, the device 420 is removed from the substrate 402 (step 360 and FIG. 4N).

Although the method of FIGS. 3 and 4A-4N has been described in connection with forming a device 420 having two electrical device layers 406 and 410, the device 420 can have more than two layers. In order to form the additional layers, the method is repeated (i.e., steps 320-355) for each additional layer prior to removing the device 420 from the substrate 402 (step 360).

As will be appreciated from the discussion above, the temperatures used for forming the flexible three-dimensional electronic device are around 100° C., which is significantly less than the 250-450° C. temperatures used in conventional CMOS processing. This allows the formation of electrically conductive vias through the polymer layer without affecting the mechanical or chemical stability of the polymer layer. Thus, the disclosed embodiments provide a flexible three-dimensional electronic device that exhibits good mechanical integrity during flexing, and accordingly allows for the electronic device to conform to various shaped objects.

The disclosed embodiments provide a flexible three-dimensional electronic device. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A flexible three-dimensional electronic device, comprising:
    a polymer layer having a first side and a second side that is opposite of the first side;
    a first flexible substrate carrying a first electronic component, wherein the first flexible substrate is arranged on the first side of the polymer layer;
    a second flexible substrate carrying a second electronic component, wherein the second flexible substrate is a flexible silicon substrate arranged on the second side of the polymer layer; and
    an electrically conductive via passing through the polymer layer to electrically connect the first and second electronic components,
    wherein the first flexible substrate is bonded to the second flexible substrate by the polymer layer as the polymer layer is cured, and
    wherein a temperature of manufacturing the flexible three-dimensional electronic device is 100° C. or less so that a mechanical and chemical stability of the polymer layer is maintained.

2. The flexible three-dimensional electronic device of claim 1, further comprising:
    an electrical contact electrically connected to the second electronic component and arranged on a top surface of the second flexible substrate, wherein
    the second electronic component is arranged on the top surface of the second flexible substrate,
    the top surface of the second flexible substrate is arranged on an opposite side of a bottom surface of the second flexible substrate,
    the bottom surface of the second flexible silicon substrate is adjacent to the second side of the polymer layer, and
    the electrically conductive via passes through the second flexible substrate and is electrically connected to the electrical contact.

3. The flexible three-dimensional electronic device of claim 2, wherein the electrical contact is a second electrical contact, the device further comprising:
    a first electrical contact electrically connected to the first electronic component and arranged on a top surface of the first flexible substrate, wherein
    the first electronic component is arranged on the top surface of the first flexible substrate,
    the top surface of the first flexible substrate is arranged on an opposite side of a bottom surface of the first flexible substrate,
    the top surface of the first flexible substrate is adjacent to the first side of the polymer layer, and
    the electrically conductive via is coupled with the second electrical contact to electrically connect the first and second electronic components.

4. The flexible three-dimensional electronic device of claim 2, wherein the electrical contact is a second electrical contact, the device further comprising:
    a first electrical contact electrically connected to the first electronic component and arranged on a bottom surface of the first flexible substrate, wherein
    the first electronic component is arranged on the bottom surface of the first flexible substrate,
    the top surface of the first flexible substrate is arranged on an opposite side of a bottom surface of the first flexible substrate,
    the top surface of the first flexible substrate is adjacent to the first side of the polymer layer, and
    the electrically conductive via passes through the first flexible substrate and is coupled with the second electrical contact to electrically connect the first and second electronic components.

5. The flexible three-dimensional electronic device of claim 1, wherein the polymer layer is a bonding layer that bonds the first and second flexible substrates to each other.

6. The flexible three-dimensional electronic device of claim 1, one of the first and second electronic components is a CMOS electronic component.

7. The flexible three-dimensional electronic device of claim 1, further comprising:
    a second polymer layer having a first side and a second side that is opposite of the first side;
    a third flexible silicon substrate carrying a third electronic component, wherein the third flexible silicon substrate is arranged on the second side of the second polymer layer and the second flexible substrate is arranged on the first side of the second polymer layer; and
    a second electrically conductive via passing through the third flexible silicon substrate to electrically connect the second and third electronic components.

8. The flexible three-dimensional electronic device of claim 1, wherein the polymer layer comprises an epoxy-based resin with a single monomer containing eight epoxide groups.

9. The flexible three-dimensional electronic device of claim 1, wherein the first flexible substrate is a flexible silicon substrate and the first and second flexible silicon substrates both include a plurality of openings passing through the first and second flexible silicon substrates.

10. The flexible three-dimensional electronic device of claim 1, wherein the first flexible substrate is a polyimide substrate.

11. A method for forming a three-dimensional electronic device, the method comprising:
    arranging a first flexible substrate carrying a first electronic component on a carrier wafer;
    forming a polymer layer on the first flexible substrate;
    arranging a second flexible substrate carrying a second electronic component on the polymer layer, wherein the second flexible substrate is a flexible silicon substrate;
    curing the polymer layer to bond the first flexible substrate to the second flexible substrate; and
    forming, using electrochemical deposition, an electrically conductive via passing through the polymer layer and electrically connecting the first and second electronic components, after the curing step,
    wherein each step is performed at a temperature of 100° C. or less so that a mechanical and chemical stability of the polymer layer is maintained.

12. The method of claim 11, wherein the formation of the electrically conductive via further comprises:
    forming a hole passing through the polymer layer; and
    forming electrically conductive metal through the second flexible substrate and the hole.

13. The method of claim 12, wherein the formation of the electrically conductive metal in the hole and through the second flexible substrate comprises:
    depositing a metal seed layer on the second flexible substrate;
    applying a photoresist on top of the metal seed layer;

patterning the photoresist to provide an opening corresponding to a location of the electrically conductive via; and growing the electrically conductive metal from the metal seed layer through the second flexible substrate and the hole.

14. The method of claim 11, further comprising:

heating, prior to forming the electrically conductive via, the combination of the first and second flexible substrates and the polymer layer to bond the first and second flexible substrates to each other.

15. The method of claim 11, further comprising:

releasing the combination of the first and second flexible substrates and the polymer layer from the carrier wafer after forming the electrically conductive via.

16. A flexible three-dimensional electronic device, comprising:

a first polymer layer having a first side and a second side that is opposite of the first side;

a first flexible substrate carrying a first electronic component and a first electrical contact, wherein the first flexible substrate is arranged on the first side of the first polymer layer;

a second flexible substrate carrying a second electronic component and a second and a third electrical contact, wherein the second flexible layer is arranged on the second side of the first polymer layer;

a second polymer layer having a first side and a second side that is opposite of the first side, wherein the second flexible substrate is arranged on the first side of the second polymer layer;

a third flexible substrate carrying a third electronic component and a fourth electrical contact, wherein the third flexible layer is arranged on the second side of the second polymer layer;

a first electrically conductive via electrically coupled to the first and second electrical contacts and passing through the first polymer layer and the second flexible substrate; and a second electrically conductive via electrically coupled the third and fourth contacts and passing through the second polymer layer and the third flexible substrate, wherein the first flexible substrate is bonded to the second flexible substrate by the polymer layer as the polymer layer is cured, and wherein a temperature of manufacturing the flexible three-dimensional electronic device is 100° C. or less so that a mechanical and chemical stability of the polymer layer is maintained.

17. The flexible three-dimensional electrical device of claim 16, wherein one of the first, second, and third flexible substrates is a flexible silicon substrate.

18. The flexible three-dimensional electrical device of claim 16, wherein one of the first, second, and third flexible substrates is a polyimide substrate.

19. The flexible three-dimensional electrical device of claim 16, wherein one of the first, second, and third electronic components is a CMOS electronic component.

20. The flexible three-dimensional electrical device of claim 16, wherein the first and second polymer layers comprise an epoxy-based resin with a single monomer containing eight epoxide groups.

* * * * *